United States Patent
Ikeda et al.

(10) Patent No.: US 7,579,888 B2
(45) Date of Patent: Aug. 25, 2009

(54) FREQUENCY SYNTHESIZER AND CHARGE PUMP CIRCUIT USED THEREIN

(75) Inventors: Takeshi Ikeda, Tokyo (JP); Hiroshi Miyagi, Kanagawa (JP)

(73) Assignee: Niigata Seimitsu Co., Ltd., Jyoetsu-shi (JP)

( * ) Notice: Subject to any disclaimer, the term of this patent is extended or adjusted under 35 U.S.C. 154(b) by 0 days.

(21) Appl. No.: 11/915,112

(22) PCT Filed: Dec. 28, 2005

(86) PCT No.: PCT/JP2005/024257

§ 371 (c)(1),
(2), (4) Date: Nov. 20, 2007

(87) PCT Pub. No.: WO2006/129396

PCT Pub. Date: Dec. 7, 2006

(65) Prior Publication Data

US 2008/0191761 A1 Aug. 14, 2008

(51) Int. Cl.
*H03L 7/06* (2006.01)
(52) U.S. Cl. .................. 327/157; 327/148; 327/536
(58) Field of Classification Search ............ None
See application file for complete search history.

(56) References Cited

U.S. PATENT DOCUMENTS 5,475,326 A * 12/1995 Masuda ............... 327/157
5,929,677 A * 7/1999 Murata ................ 327/157

FOREIGN PATENT DOCUMENTS

JP 2005-252930 9/2005

* cited by examiner

*Primary Examiner*—Cassandra Cox
(74) *Attorney, Agent, or Firm*—Connolly Bove Lodge & Hutz LLP; Myron Keith Wyche

(57) ABSTRACT

There are included a signal generating circuit (8) that generates, based on a comparison signal outputted from a phase comparator (3) and a clock signal outputted from a crystal oscillation circuit (1) and having a shorter pulse width than the comparison signal, a control signal obtained from a logical product of the two signals; and a charge pump circuit that performs, based on the control signal from the signal generating circuit (8), a charging or discharging operation of a capacitor. The charging or discharging operation of the capacitor is gradually performed little by little based on the control signal having the shorter pulse width than the conversional comparison signal, whereby even if the capacitance value of the capacitor is reduced, the substantial time constant can be enlarged, resulting in a stable operation of a frequency synthesizer.

5 Claims, 4 Drawing Sheets

Background Art

FREQUENCY SYNTHESIZER AND CHARGE PUMP CIRCUIT USED THEREIN

CROSS REFERENCE TO RELATED APPLICATION

This application is a national stage application (under 35 U.S.C. § 371) of PCT/JP2005/024257 filed Dec. 28, 2005, which claims benefit of Japanese Application No. 2005-163070 filed Jun. 2, 2005, disclosure of which is incorporated herein by reference.

1. Technical Field

The present invention relates to a frequency synthesizer and a charge pump circuit used therein, and in particular to a way of improving a charging operation and a discharging operation in a capacitor used in the charge pump circuit of the frequency synthesizer.

2. Background Art

Generally, in wireless communication devices, a frequency synthesizer using a PLL (Phase Locked Loop) is used as a local oscillator circuit. FIG. 1 shows a general construction for a frequency synthesizer using a PLL. As shown in FIG. 1, the frequency synthesizer is constructed to include a crystal oscillation circuit 1, a reference frequency divider 2, a phase comparator 3, a charge pump circuit 4, a low pass filter (LPF) 5, a voltage control oscillator (VCO) 6, and a variable frequency divider 7.

The crystal oscillation circuit 1 generates a signal with a prescribed frequency. The reference frequency divider 2 divides the frequency of the clock signal outputted from the crystal oscillation circuit 1 at a fixed ratio, thereby generating a reference signal at a reference frequency. The phase comparator 3 detects a phase difference between the reference signal outputted from the reference frequency divider 2 and a variable frequency signal outputted from the variable frequency divider 7, and outputs a comparison signal of logic "H" or logic "L" from an Up terminal and a Down terminal depending on the detected phase difference. The charge pump circuit 4 outputs a signal proportional to the phase difference detected using the phase comparator 3 by performing the charging operation or the discharging operation based on the comparison signals outputted from the Up terminal and the Down terminal of the phase comparator 3.

The LPF 5 removes high frequency components of the signal outputted from the charge pump circuit 4, and outputs the resulting signal to the VCO 6. The VCO 6 generates a frequency proportional to the voltage of the signal outputted from the LPF 5, and outputs the result as a local oscillation signal to outside of the frequency synthesizer and to the variable frequency divider 7. The variable frequency divider 7 divides the output frequency of the VCO 4 using a specified division ratio, and outputs the result as a variable frequency signal to the phase comparator 3.

FIG. 2 shows an example construction for the charge pump circuit 4. The charge pump circuit 4 is constructed to include current mirror circuits 11 and 12, an inverter circuit 13 connected between the Down terminal of the phase comparator 3 and the second current mirror circuit 12 for inverting the logic level of the comparison signal outputted from the Down terminal, constant current source circuits 14 and 15 connected to the current mirror circuits 11 and 12, and a loop filter 16 having a capacitor C and a resistor R, as shown in FIG. 2.

The first current mirror circuit 11 is constructed by connecting together three pMOS transistors Tr1 to Tr3 to form a current mirror, and performs the charging operation on the capacitor C based on the comparison signal outputted from Up terminal of the phase comparator 3 using a first constant current source circuit 14. The second current mirror circuit 12 is constructed by connecting together three nMOS transistors Tr4 to Tr6 to form a current mirror, and performs the discharging operation on the capacitor C based on the comparison signal outputted from Down terminal of the phase comparator 3 using a second constant current source circuit 15.

The following describes operations of a conventional frequency synthesizer constructed in the manner described above. The phase comparator 3 detects a phase difference between the reference signal outputted from the reference frequency divider 2 and the variable frequency signal outputted from the variable frequency divider 7. When a phase of the variable frequency signal is behind a phase of the reference signal, a comparison signal that is a logic "H" with a pulse width dependent on the phase difference is outputted from the Up terminal of the phase comparator 3. At this point, a logic "L" comparison signal is outputted from the Down terminal of the phase comparator 3.

On the other hand, when the phase of the variable frequency signal is ahead of the phase of the reference signal, a comparison signal that is a logic "H" with a pulse width dependent on the phase difference is outputted from the Down terminal of the phase comparator 3. At this point, a logic "L" comparison signal is outputted from the Up terminal of the phase comparator 3. When the phase of the variable frequency signal is synchronized with the phase of the reference signal, a logic "L" comparison signal is outputted from both of the Up terminal and the Down terminal of the phase comparator 3. The comparison signals outputted from the Up terminal and the Down terminal are inputted to the charge pump circuit 4.

When the logic "H" comparison signal outputted from the Up terminal of the phase comparator 3 is received by the transistor 11, the charge pump circuit 4 operates to charge the capacitor C of the loop filter 16 using the constant current source circuit 14. When the logic "H" comparison signal outputted from the Down terminal of the phase comparator 3 is received by the transistor 12 via the inverter circuit 13, the charge pump circuit 4 operates to discharge the capacitor C of the loop filter 16 using the constant current source circuit 15.

When the output terminal voltage rises due to the charge pump circuit 4 charging the capacitor C, the oscillation frequency of the VCO 6 rises. On the other hand, when the output terminal voltage falls due to the charge pump circuit 4 discharging the capacitor C, the oscillation frequency of the VCO 6 falls. The local oscillation signal outputted by the VCO 6 is fed back to the phase comparator 3 via the variable frequency divider 7.

When the frequency of the variable frequency signal is lower than the frequency of the reference signal (i.e. the phase of the variable frequency signal is behind the phase of the reference signal), since the output frequency of the VCO 6 rises in the manner described, the frequency of the variable frequency signal rises and the phase difference with the reference signal is reduced. As a result, the frequency of the local oscillation signal outputted by the VCO 6 gets closer to a desired frequency that is proportional to frequency of the reference signal.

When a frequency of the variable frequency signal is higher than the frequency of the reference signal (i.e. the phase of the variable frequency signal is ahead of the phase of the reference signal), since the output frequency of the VCO 6 falls in the manner described, the frequency of the variable frequency signal falls and the phase difference with the reference signal is reduced. As a result, the frequency of the local oscillation signal outputted by the VCO 6 gets closer to a desired frequency that is proportional to frequency of the reference signal.

Thus, irrespective of the frequency of the variable frequency signal (a frequency proportional to the output frequency of the VCO 6) higher or lower than the reference signal frequency, the frequency synthesizer ultimately operates to bring the frequency of the variable frequency signal closer to the frequency of the reference signal, and the oscillation frequency of the VCO 6 is thereby locked to a constant frequency. When in this locked state, the comparison signal outputted from both the Up terminal and the Down terminal of the phase comparator 3 is a logic "L" signal.

In the frequency synthesizer with the above construction, the lower the frequency compared by the phase comparator 3, the higher the capacitance necessary in the capacitor C. Hence, it is difficult to integrate the loop filter 16 containing the capacitor C into a semiconductor chip. Because of this, the loop filter 16 is conventionally provided as an off-chip part. However, in recent years there have been strong demands for the off-chip part to be integrated into the semiconductor chip.

Conventionally, there are various proposals for integrating the capacitor C of the loop filter 16 into the semiconductor chip (see Patent Documents 1 and 2, for instance).

[Patent Document 1]: Japanese Patent Laid-Open No. H11-122100

[Patent Document 2]: Japanese Patent Laid-Open No. H11-150735

The technologies disclosed in Patent Documents 1 and 2 both reduce the capacitance of the capacitor C, thereby allowing the capacitor C to be built in to the semiconductor chip.

DISCLOSURE OF THE INVENTION

However, to ensure stable operation of the frequency synthesizer, a time constant $\tau$ (=CR), which is defined using the capacitor C and the resistor R in the loop filter 16, must be set to a large value. Since the capacitor C is charged based on the time constant $\tau$, when the time constant $\tau$ is large, the terminal voltage of the capacitor C (the output terminal voltage of the charge pump circuit 4) rises gently. However, when inclusion on the semiconductor chip is achieved by simply reducing the capacitance of the capacitor C, the time constant $\tau$ is reduced, and the problem of unstable operation of the frequency synthesizer occurs.

It is conceivable to prevent a reduction in the time constant $\tau$ by reducing the constant current value of the constant current source circuits 14 and 15 so as to decrease the current flowing in the capacitor C while reducing the capacitance of the capacitor C. However, since there is a limit to reducing the constant current value of the constant current source circuits 14 and 15 to stably operate the charge pump circuit 4, the reduction in the time constant $\tau$ is inevitable.

The present invention is provided to solve this problem and has an object to built the loop filter into the semiconductor chip by reducing the capacitance of the capacitor without reducing the time constant.

To solve the above-described problem, in the present invention, a control signal is generated by taking the logical product of the comparison signal outputted from the phase comparator and a clock signal having a pulse width shorter than the comparison signal, and the charging operation and discharging operation are then performed based on the control signal.

According the invention of the above construction, it is possible to gradually charge and discharge the capacitor in small steps based on the control signal having the pulse width that is shorter than the conventional comparison signal. Hence, the time constant can effectively be made large even when the capacitance of the capacitor is small, and stable operation can be achieved for the frequency synthesizer. Hence, it is possible to reduce the capacitance of the capacitor without destabilizing operation of the frequency synthesizer, and build the loop filter which includes the capacitor and the resistor into the semiconductor chip.

DETAILED DESCRIPTION OF THE PREFERRED EMBODIMENTS

First Embodiment

Figure 3:
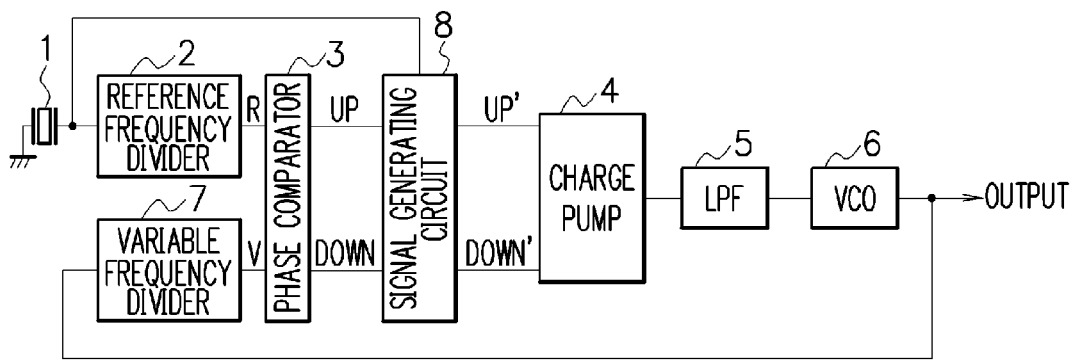
FIG. 3 shows an example of an overall construction of the frequency synthesizer of first and second embodiments.

The following describes a first embodiment of the present invention with reference to the drawings. FIG. 3 shows an example of an overall construction of the frequency synthesizer of first embodiment. In FIG. 3, objects marked with the same symbols as in FIG. 1 function the same way, and further descriptions are omitted.

As shown in FIG. 3, in the frequency synthesizer of the present embodiment, a signal generating circuit 8 is provided between the phase comparator 3 and the charge pump circuit 4. The signal generating circuit 8 generates a control signal obtained by taking a logical product of the comparison signals outputted from the Up terminal and the Down terminal of the phase comparator 3 and a clock signal having pulse width shorter than the comparison signal. In the present embodiment, a signal outputted from the crystal oscillation circuit 1 is used as the clock signal having the pulse width shorter the comparison signal.

Figure 4:
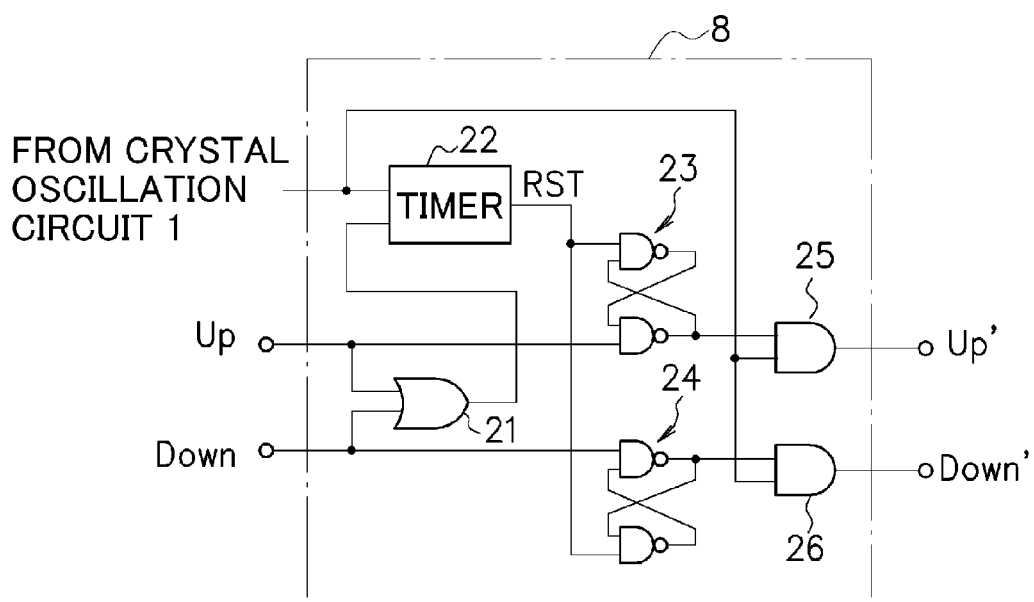
FIG. 4 shows an example of an overall construction of the signal generation circuit of the first and second embodiments.

FIG. 4 shows an example construction for the signal generating circuit 8. As shown in FIG. 4, the signal generating circuit 8 of the present embodiment includes an OR circuit 21, a timer 22, latch circuits 23 and 24, and AND circuits 25 and 26. The OR circuit 21 takes the logical sum of the comparison signal outputted from the Up terminal of the phase comparator 3 and the comparison signal outputted from the Down terminal of the phase comparator 3. In other words, when the output signal of either the Up terminal or the Down terminal of the phase comparator 3 is logic "H", the OR circuit 21 outputs a logic "H".

The timer 22 performs a count operation based on each prescribed frequency clock signal outputted from the crystal oscillation circuit 1, and outputs a reset signal RST on receiving a logic "L" signal from the OR circuit 21. The latch circuits 23 and 24 latch the respective comparison signals outputted from the Up terminal and Down terminal of the phase comparator 3. The latch circuits 23 and 24 reset the latched comparison signal when the reset signal RST is inputted from the timer 22.

The AND circuits 25 and 26 take the logical product of the signal outputted from the latch circuits 23 and 24 and the prescribed frequency clock signal outputted from the crystal oscillation circuit 1. In other words, the first AND circuit 25 outputs a logic "H" control signal from the Up' terminal for any period over which both the comparison signal outputted from the Up terminal of the phase comparator 3 and the clock signal outputted from the crystal oscillation circuit 1 are logic "H". Moreover, the second AND circuit 26 outputs a logic "H" control signal from the Down' terminal for any period over which both the comparison signal outputted from the Down terminal of the phase comparator 3 and the clock signal outputted from the crystal oscillation circuit 1 are logic "H".

Figure 5:
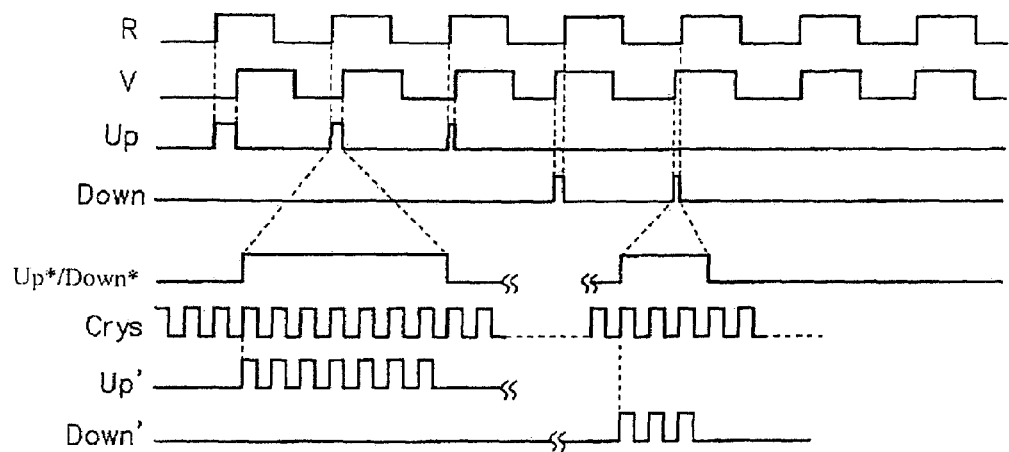
FIG. 5 is a timing chart showing an example of operations of the frequency synthesizer of the first and second embodiments.

The following describes operations of the frequency synthesizer according to the present embodiment with the above construction, with reference to the timing chart shown in FIG. 5. The phase comparator 3 detects a phase difference between the reference signal (R in FIG. 5) outputted from the reference frequency divider 2 and the variable frequency signal (V in FIG. 5) outputted from the variable frequency divider 7. When the phase of the variable frequency signal is behind the phase of the reference signal, a logic "H" comparison signal with a pulse width dependent on the phase difference is outputted from the Up terminal of the phase comparator 3 (former half of Up in FIG. 5). At this point, a logic "L" comparison signal is outputted from the Down terminal of the phase comparator 3 (former half of Down in FIG. 5).

The logic "H" comparison signal outputted from the Up terminal of the phase comparator 3 and logic "L" comparison signal outputted from the Down terminal are inputted to the signal generating circuit 8. By taking the logical product of the logic "H" comparison signal (former half of Up in FIG. 5) outputted from the Up terminal of the phase comparator 3 and the prescribed frequency clock signal (Crys in FIG. 5) outputted from the crystal oscillation circuit 1, the signal generating circuit 8 generates a control signal which is logic "H" in a cycle of the prescribed frequency while the comparison signal outputted from the Up terminal is logic "H", and outputs the generated control signal from the Up' terminal (Up' in FIG. 5). Moreover by taking the logical product of the logic "L" comparison signal (former half of Down in FIG. 5) outputted from the Down terminal of the phase comparator 3 and the prescribed frequency clock signal (Crys in FIG. 5) outputted from the crystal oscillation circuit 1, the signal generating circuit 8 generates a logic "L" control signal and outputs the generated logic "L" control signal from the Down' terminal. The Up*/Down* signal of FIG. 5 provides a view on an expanded time scale of the indicated portions of the Up/Down signal terminals, respectively.

The control signals outputted from the Up' terminal and the Down' terminal of the signal generating circuit 8 are inputted to the charge pump circuit 4. The charge pump circuit 4 is of the same construction as that shown in FIG. 2 (except in that the Up terminal and the Down terminal are replaced with the Up' terminal and the Down' terminal).

Figure 2:
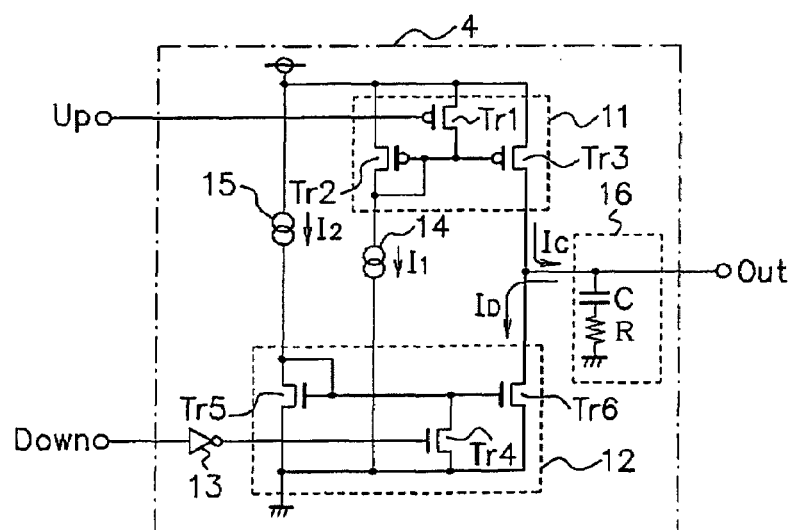
FIG. 2 shows an example construction for the charge pump circuit.

In FIG. 2, when the logic "H" control signal outputted from the Up° terminal of the signal generating circuit 8 is inputted to the gate of the pMOS transistor Tr1 in the first current mirror circuit 11, the pMOS transistor Tr1 switches off. When the pMOS transistor Tr1 is off, a logic "L" signal is inputted to the gates of the two pMOS transistors Tr2 and Tr3 connected to form the current mirror, causing the pMOS transistors Tr2 and Tr3 to switch on. As a result, a constant current $I_1$ flows from the power source terminal to the ground terminal through the pMOS transistor Tr2 and the first constant current source circuit 14.

The logic "L" control signal outputted from the Down' terminal of the signal generating circuit 8 is inverted by the inverter circuit 13. Thus, a logic "H" signal is inputted to the gate of the nMOS transistor Tr4 in the second current mirror circuit 12. As a result the nMOS transistor Tr4 switches on. When the nMOS transistor Tr4 is on, a logic "L" signal is inputted to the gates of the two nMOS transistors Tr5 and Tr6 connected to form the current mirror, causing the nMOS transistors Tr5 and Tr6 to be switched off.

As described above, when the pMOS transistors Tr2 and Tr3 of the first current mirror circuit 11 are switched on and the nMOS transistors Tr5 and Tr6 of the second current mirror circuit 12 are switched off, the constant current $I_1$ flowing in the pMOS transistor Tr2 causes a constant current $I_c$ to flow from the pMOS transistor Tr3 connected to the pMOS transistor Tr2 in the current mirror towards the output terminal Out of the charge pump circuit 4. As a result, the capacitor C of the loop filter 16 is charged by the constant current $I_c$ which flows like being poured out towards the output terminal Out.

Charging up the capacitor C in this way causes the terminal voltage of the capacitor C (output terminal voltage of the charge pump circuit 4) to rise, and the oscillation frequency of the VCO 6 rises accordingly. Hence, there is a rise in the frequency of the signal fed back to the phase comparator 3 from the VCO 6 via the variable frequency divider 7. The frequency of the variable frequency signal, which was lower than the frequency of the reference signal, therefore moves closer to the frequency of the reference signal. As a result, the frequency of the local oscillation signal outputted by the VCO 6 moves closer to the desired frequency that is proportional to the frequency of the reference signal.

On the other hand, when the phase of the variable frequency signal is ahead of the phase of the reference signal, a logic "H" comparison signal with a pulse width dependent on the phase difference is outputted from the Down terminal of the phase comparator 3 (latter half of Down in FIG. 5). At this point, a logic "L" comparison signal (latter half of Up in FIG. 5) is outputted from the Up terminal of the phase comparator 3.

The logic "L" comparison signal outputted from the Up terminal and the logic "H" comparison signal outputted from the Down terminal of the phase comparator 3 are inputted to the signal generating circuit 8. The signal generating circuit 8 generates a logic "L" control signal by taking the logical product of the logic "L" comparison signal (latter half of Up in FIG. 5) outputted from the Up terminal of the phase comparator 3 and the prescribed frequency clock signal (Crys in FIG. 5) outputted from the crystal oscillation circuit 1, and outputs the generated logic "L" control signal from the Up' terminal. Moreover by taking the logical product of the logic "H" comparison signal (latter half of Down in FIG. 5) outputted from the Down terminal of the phase comparator 3 and the prescribed frequency clock signal (Crys in FIG. 5) outputted from the crystal oscillation circuit 1, the signal generating circuit 8 generates a control signal which is logic "H" in a cycle of prescribed frequency while the comparison signal outputted from the Down terminal is logic "H", and outputs the generated control signal from the Down' terminal (Down' in FIG. 5).

The control signals outputted from the Up' terminal and the Down' terminal of the signal generating circuit 8 are inputted to the charge pump circuit 4. When the logic "H" control signal outputted from the Down' terminal of signal generating circuit 8, the charge pump circuit 4 operates to discharge the capacitor C of the loop filter 16 using the second constant current source circuit 15.

Specifically, the logic "H" control signal outputted from the Down' terminal of the signal generating circuit 8 is inverted by the inverter circuit 13. A logic "L" signal is therefore inputted to the gate of the nMOS transistor Tr4 in the second current mirror circuit 12. As a result, the nMOS transistor Tr4 switches off. When the nMOS transistor Tr4 is off, a logic "H" signal is inputted to the gates of the two nMOS transistors Tr5 and Tr6 connected to form the current mirror, causing the nMOS transistors Tr5 and Tr6 to switch on. As a result, a constant current $I_2$ flows from the power source terminal to the ground terminal through the second constant current source circuit 15 and the nMOS transistor Tr5.

The logic "L" control signal outputted from the Up' terminal of the signal generating circuit 8 is inputted to the gate of the pMOS transistor Tr1 which forms part of the first current mirror circuit 11. As a result, the pMOS transistor Tr1 switches on. When the pMOS transistor Tr1 is on, a logic "H" signal is inputted to the gates of the two pMOS transistors Tr2 and Tr3 connected to form the current mirror, causing the pMOS transistors Tr2 and Tr3 to switch off.

As described above, when the pMOS transistors Tr2 and Tr3 of the first current mirror circuit 11 are switched off and the nMOS transistors Tr5 and Tr6 of the second current mirror circuit 12 are switched on, the constant current $I_2$ flowing in the nMOS transistor Tr5 causes a constant current $I_D$ to flow like being pulled from the capacitor C in the loop filter 16 towards the ground terminal via the nMOS transistor Tr6 connected to the nMOS transistor Tr5 in the current mirror, thereby discharging the capacitor C.

Discharging the capacitor C in this way causes the terminal voltage of the capacitor C (output terminal voltage of the charge pump circuit 4) to fall, and the oscillation frequency of the VCO6 falls accordingly. Hence, there is a drop in the frequency of the signal fed back from the VCO 6 to the phase comparator 3 via the variable frequency divider 7. Thus, the frequency of the variable frequency signal, which was higher than the frequency of the reference signal, moves closer to the frequency of the reference signal. As a result, the frequency of the local oscillation signal outputted from the VCO 6 moves closer to the desired frequency that is proportional to the frequency of the reference signal.

Thus, irrespective of the frequency of the variable frequency signal higher or lower than the frequency of the reference signal, the frequency synthesizer ultimately operates to bring the frequency of the variable frequency signal closer to that of the reference signal, and the oscillation frequency of the VCO 6 is thereby locked to a constant frequency. In this locked state, in which the phases of variable frequency signal and the reference signal are synchronized, the comparison signals outputted from the Up terminal and the Down terminal of the phase comparator 3 are both logic "L".

When logic "L" comparison signals are outputted from both the Up terminal and the Down terminal, logic "L" control signals are also outputted from the Up' terminal and the Down' terminal of the signal generating circuit 8. On receiving logic "L" control signals from both the Up' terminal and the Down' terminal of the signal generating circuit 8, the charge pump circuit 4 moves into a high impedance state.

In other words, when the Up' terminal and the Down' terminal are both logic "L", the pMOS transistor Tr1 of the first current mirror circuit 11 and the nMOS transistor Tr4 of the second current mirror circuit 12 both switch on. As a result, the pMOS transistors Tr2 and Tr3 of the first current mirror circuit 11 and the nMOS transistors Tr5 and Tr6 of the second current mirror circuit 12 are all switched off, and the charge pump circuit 4 moves into a high impedance state in which neither the constant current $I_c$ nor the constant current $I_D$ flow.

As described in detail above, in the present embodiment, rather than charging and discharging the capacitor C using the comparison signal outputted from the Up terminal and Down terminal of the phase comparator 3, the charging and discharging of the capacitor C is performed using a control signal obtained by taking the logical product of the comparison signal and the clock signal, which has a pulse width shorter than the comparison signal. Thus, based on the shorter pulse width of the control signal in comparison to the comparison signal, the operations to charge and discharge the capacitor C are performed more gradually in small steps.

Figure 1:
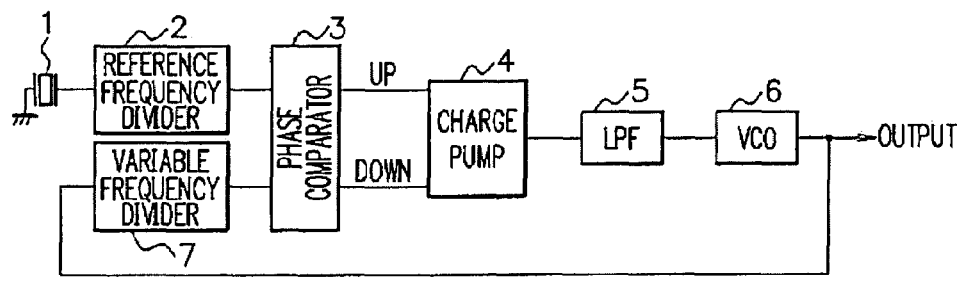
FIG. 1 shows an example of an overall construction of a conventional frequency synthesizer.
Figure 6:
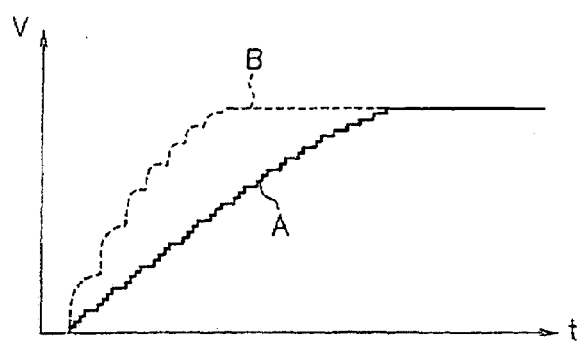
FIG. 6 shows an example of a charge operation (time constant) of a capacitor of the first and second embodiments.

FIG. 6 shows a charge operation for the capacitor C. In FIG. 6, the solid line A shows characteristics when the present embodiment is applied with a reduced capacitance value for the capacitor C (i.e. the frequency synthesizer constructed as shown in FIG. 3), and the dashed line B shows characteristics when the capacitance value of the capacitor C is simply reduced without applying the present embodiment (i.e. the frequency synthesizer constructed as shown in FIG. 1).

Thus, according to the present embodiment, even when a capacitor C with a small capacitance value is used, it is possible to maintain the time constant τ at approximately the same level as in conventional frequency synthesizers in which a large-value capacitor C is provided in an off-chip loop filter 16. Hence, it is possible to reduce the capacitance value of the capacitor C without destabilizing operation of the frequency synthesizer, and build the loop filter 16 including the capacitor C and the resistor R into the semiconductor chip.

Second Embodiment

Figure 7:
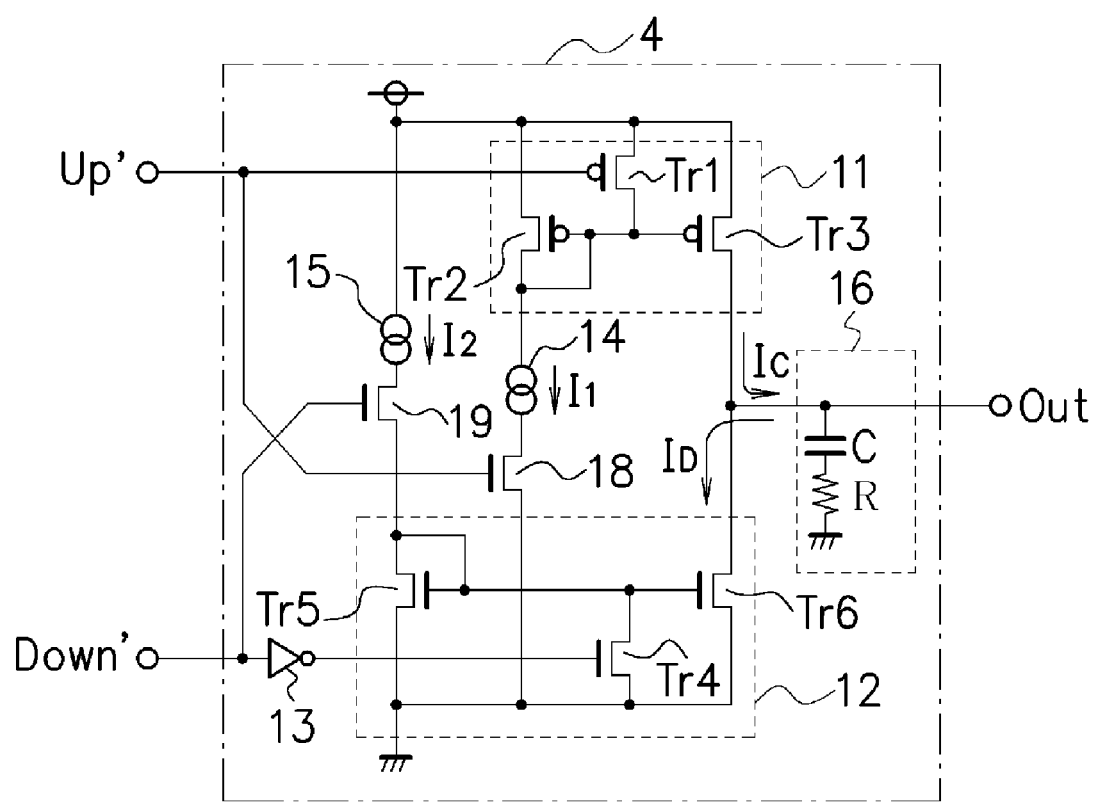
FIG. 7 shows an example construction of a charge pump circuit of the second embodiment.

The following describes the second embodiment of the present invention. FIG. 7 shows an example construction of a charge pump circuit 4 of the second embodiment. In FIG. 7, objects marked with the same symbols as in FIG. 2 function in the same way, and further descriptions are omitted. Also, the overall construction of the frequency synthesizer using the charge pump circuit 4 is the same as in FIG. 3.

In addition to the construction elements shown in FIG. 2, the charge pump circuit 4 of the second embodiment includes a further two nMOS transistors 18 and 19. The first nMOS transistor 18 is connected between the first constant current source circuit 14 and the ground terminal with the gate connecting to the Up' terminal of the signal generating circuit 8. The second nMOS transistor 19 is connected between the second constant current source circuit 15 and the second current mirror circuit 12 with the gate connecting to the Down' terminal of the signal generating circuit 8.

The two nMOS transistors 18 and 19 are on when a logic "H" signal is outputted from the signal generating circuit 8 and off when a logic "L" signal is outputted from the signal generating circuit 8. Thus, the two nMOS transistors 18 and 19 function as a switching circuit to switch between connection and disconnection of the constant current circuits 14 and 15 based on the control signal outputted from the signal generating circuit 8.

The following describes operations of the charge pump circuit 4 constructed as shown in FIG. 7 and a frequency synthesizer which is of the type shown in FIG. 3 and includes this charge pump circuit 4. The phase comparator 3 detects a phase difference between the reference signal (R in FIG. 5) outputted from the reference frequency divider 2 and the variable frequency signal (V in FIG. 5) outputted from the variable frequency divider 7. When the phase of the variable frequency signal is behind the phase of the reference signal, a logic "H" comparison signal with a pulse width dependent on the phase difference is outputted from the Up terminal of the phase comparator 3 (former half of Up in FIG. 5). At this point, a logic "L" comparison signal is outputted from the Down terminal of the phase comparator 3 (former half of Down in FIG. 5).

The logic "H" comparison signal outputted from the Up terminal and the logic "L" comparison signal outputted from the Down terminal of the phase comparator 3 are inputted to the signal generating circuit 8. By taking the logical product of the logic "H" comparison signal (former half of Up in FIG. 5) outputted from the Up terminal of the phase comparator 3 and the prescribed frequency clock signal (Crys in FIG. 5) outputted from the crystal oscillation circuit 1, the signal generating circuit 8 generates a control signal which is logic "H" in a cycle of prescribed frequency while the comparison signal outputted from the Up terminal is logic "H", and outputs the generated control signal from the Up' terminal (Up' in FIG. 5). Further, by taking the logical product of the logic "L" comparison signal (former half of Down in FIG. 5) outputted from the Down terminal of the phase comparator 3 and the prescribed frequency clock signal outputted from the crystal oscillation circuit 1, the signal generating circuit 8 generates a logic "L" control signal, and outputs the generated logic "L" control signal from the Down' terminal.

The control signals outputted from the Up' terminal and the Down' terminal of the signal generating circuit 8 are inputted to the charge pump circuit 4. When the logic "H" control signal outputted from the Up' terminal of the signal generating circuit 8 is inputted to the gate of the pMOS transistor Tr1 which forms part of the first current mirror circuit 11, the pMOS transistor Tr1 switches off. When the pMOS transistor Tr1 is off, a logic "L" signal is inputted to the gates of two pMOS transistors Tr2 and Tr3 connected to form the current mirror, causing the pMOS transistors Tr2 and Tr3 to switch on.

On the other hand, since a logic "H" control signal is outputted from the Up' terminal of the signal generating circuit 8, the first nMOS transistor 18 is on. As a result, a constant current $I_1$ flows from the power source terminal to the ground terminal through the pMOS transistor Tr2, the first constant current source circuit 14 and the first nMOS transistor 18.

The logic "L" control signal outputted from the Down' terminal of the signal generating circuit 8 is inverted by the inverter circuit 13. A logic "H" signal is therefore inputted to the gate of the nMOS transistor Tr4 in the second current mirror circuit 12. As a result, the nMOS transistor Tr4 switches on. When the nMOS transistor Tr4 is on, a logic "L" signal is inputted to the gates of the two nMOS transistors Tr5 and Tr6 connected to form the current mirror, causing the nMOS transistors Tr5 and Tr6 switch off.

As described above, when the pMOS transistors Tr2 and Tr3 of the first current mirror circuit 11 are switched on and the nMOS transistors Tr5 and Tr6 of the second current mirror circuit 12 are switched off, the constant current $I_1$ flowing in the pMOS transistor Tr2 causes a constant current $I_c$ to flow from the pMOS transistor Tr3 connected to the transistor Tr2 in the current mirror towards the output terminal Out of the charge pump circuit 4. The capacitor C of the loop filter 16 is then charged by the constant current $I_c$ which flows like being poured out towards the output terminal Out for emission.

Charging up the capacitor C in this way causes the terminal voltage of the capacitor C (output terminal voltage of the charge pump circuit 4) to rise, and the oscillation frequency of the VCO 6 rises accordingly. Hence, there is a rise in the frequency of the signal fed back from the VCO 6 to the phase comparator 3 via the variable frequency divider 7. The frequency of the variable frequency signal, which was lower than the frequency of the reference signal, therefore moves closer to the frequency of the reference signal. As a result, the frequency of the local oscillation signal outputted by the VCO 6 moves closer to the desired frequency that is proportional to the frequency of the reference signal.

When this charging operation is performed on the capacitor C, a logic "L" control signal is outputted from the Down' terminal of the signal generating circuit 8, causing the second nMOS transistor 19 to switch off. As a result, the flow of the constant current $I_2$ from the power source terminal to the ground terminal ceases.

On the other hand, when the phase of the variable frequency signal is ahead of the phase of the reference signal, a logic "H" comparison signal with a pulse width dependent on the phase difference is outputted from the Down terminal of the phase comparator 3 (the latter half of Down in FIG. 5). At this point, a logic "L" comparison signal is outputted from the Up terminal of the phase comparator 3 (latter half of Up in FIG. 5).

The logic "L" comparison signal outputted from the Up terminal and the logic "H" comparison signal outputted from the Down terminal of the phase comparator 3 are inputted to the signal generating circuit 8. By taking the logical product of the logic "L" comparison signal (former half of Up in FIG. 5) outputted from the Up terminal of the phase comparator 3 and the prescribed frequency clock signal (Crys in FIG. 5) outputted from the crystal oscillation circuit 1, the signal generating circuit 8 generates a logic "L" control signal, and outputs the generated logic "L" control signal from the Up' terminal. Further, by taking the logical product of the logic "H" comparison signal (latter half of Down in FIG. 5) outputted from the Down terminal of the phase comparator 3 and the prescribed frequency clock signal (Crys in FIG. 5) outputted from the crystal oscillation circuit 1, the signal generating circuit 8 generates a control signal which is logic "H" in a cycle of the prescribed frequency while the comparison signal outputted from the Down terminal is logic "H", and outputs the generated control signal from the Down' terminal (Down' in FIG. 5).

The control signals outputted from the Up' terminal and the Down' terminal of the signal generating circuit 8 are inputted to the charge pump circuit 4. On receiving the logic "H" control signal from the Down' terminal of signal generating circuit 8, the charge pump circuit 4 operates to discharge the capacitor C of the loop filter 16 using the second constant current source circuit 15.

Specifically, the logic "H" control signal outputted from the Down' terminal of the signal generating circuit 8 is inverted by the inverter circuit 13. A logic "L" signal is therefore inputted to the gate of the nMOS transistor Tr4 in the second current mirror circuit 12. As a result, the nMOS transistor Tr4 switches off. When the nMOS transistor Tr4 is off, a logic "H" signal is inputted to the gates of the two nMOS transistors Tr5 and Tr6 connected to form the current mirror, causing the nMOS transistors Tr5 and Tr6 to switch on.

On the other hand, since, a logic "H" signal is outputted from the Down' terminal of the signal generating circuit 8, the second nMOS transistor 19 switches on. As a result, the constant current $I_2$ flows from the power source terminal to the ground terminal through the second constant current source circuit 15, the second nMOS transistor 19 and the nMOS transistor Tr5.

The logic "L" control signal outputted from the Up' terminal of the signal generating circuit 8 is inputted to the gate of the pMOS transistor Tr1 which forms part of the first current mirror circuit 11. Hence, the pMOS transistor Tr1 switches on. When the pMOS transistor Tr1 is on, a logic "H" signal is inputted to the gates of the two pMOS transistors Tr2 and Tr3 connected to form the current mirror, causing the pMOS transistors Tr2 and Tr3 to switch off.

As described above, when the pMOS transistors Tr2 and Tr3 of the first current mirror circuit 11 are switched off and the nMOS transistors Tr5 and Tr6 of the second current mirror circuit 12 are switched on, the constant current $I_2$ flowing in the nMOS transistor Tr5 causes a constant current $I_D$ to flow like being pulled from the capacitor C in the loop filter 16 towards the ground terminal via the nMOS transistor Tr6 connected to the nMOS transistor Tr5 in the current mirror, thereby discharging the capacitor C.

Discharging the capacitor C in this way causes the terminal voltage of the capacitor C (output terminal voltage of the charge pump circuit 4) to fall, and the oscillation frequency of the VCO 6 falls accordingly. Hence, there is a drop in the frequency of the signal fed back to the phase comparator 3 from the VCO 6 via the variable frequency divider 7. The frequency of the variable frequency signal, which was higher than the frequency of the reference signal, therefore moves closer to the frequency of the reference signal. As a result, the frequency of the local oscillation signal outputted from the VCO 6 moves closer to the desired frequency that is proportional to the frequency of the reference signal.

When this discharging operation is being performed on the capacitor C, a logic "L" control signal is outputted from the Up' terminal of the signal generating circuit 8, causing the first nMOS transistor 18 to switch off. As a result, the flow of the constant current $I_1$ from the power source terminal to the ground terminal ceases.

Thus, irrespective of the frequency of the variable frequency signal higher or lower than the frequency of the reference signal, the frequency synthesizer ultimately operates to bring the frequency of the variable frequency signal closer to the frequency of the reference signal, and thereby the oscillation frequency of the VCO 6 is locked to a constant frequency. In this locked state, in which the phases of the variable frequency signal and the reference signal are synchronized, the comparison signals outputted from the Up terminal and the Down terminal of the phase comparator 3 are both logic "L".

When logic "L" comparison signals are outputted from both the Up terminal and the Down terminal, logic "L" control signals are also outputted from the Up' terminal and the Down' terminal of the signal generating circuit 8. On receiving logic "L" control signals from both the Up' terminal and the Down' terminal of the signal generating circuit 8, the charge pump circuit 4 moves into a high impedance state.

In other words, when the Up' terminal and the Down' terminal are both logic "L", the pMOS transistor Tr1 of the first current mirror circuit 11 and the nMOS transistor Tr4 of the second current mirror circuit 12 both switch on. As a result, the pMOS transistors Tr2 and Tr3 of the first current mirror circuit 11 and the nMOS transistors Tr5 and Tr6 of the second current mirror circuit 12 are all switched off, and the charge pump circuit 4 moves into a high impedance state in which neither the constant current $I_C$ nor the constant current $I_D$ flow.

At this point, the logic "L" control signals outputted from the Up' terminal and the Down' terminal of the signal generating circuit 8 cause both the first nMOS transistor 18 and the second nMOS transistor 19 to switch off. As a result, the flow of the currents $I_1$ and $I_2$ from the power source terminal to the ground terminal ceases.

As described in detail above, in the second embodiment, the second nMOS transistor 19 cuts the connection with the second constant current circuit 15 during the operation to charge the capacitor C, and the first nMOS transistor 18 cuts the connection of the first constant current circuit 16 during the operation to discharge the capacitor C. Also, when the frequency synthesizer is in the high impedance state (lock state), the two nMOS transistors 18 and 19 cut the connections of the constant current circuits 15 and 16. This allows the elimination of currents $I_1$ and $I_2$ flowing in paths not related to operation, and thereby reduces current consumption.

Note that although in the first and second embodiments an example is described in which the signal generating circuit 8 is constructed as shown FIG. 4, the present invention is not limited to such a construction. For instance, rather than providing the OR circuit 21, the timer 22, and the latche circuits 23 and 24, the signal generating circuit may be constructed using only the AND circuits 25 and 26.

Moreover, although in the first and second embodiments an example is described in which the signal generating circuit 8 and the charge pump circuit 4 are constructed as separate blocks, the signal generating circuit 8 may be built into the charge pump circuit 4. In this case, the built in circuit may be the circuit shown in FIG. 4 or the AND circuits 25 and 26 alone.

In the first and second embodiments, an example in which the circuits operate in accordance with active Hi (logic which is active for logic "H") was described, but the circuits can be constructed to operate in accordance with active Low.

Also, in the above-described first and second embodiments, an example is described in which the signal outputted from the crystal oscillation circuit 1 is used as the clock signal having a pulse width shorter than the comparison signal outputted from the Up terminal and the Down terminal of the phase comparator 3. However, the present invention is not limited to this arrangement. For instance, a signal taken from the reference frequency divider 2, midway through the division of the signal outputted by the crystal oscillation circuit 1, may be used as the clock signal. Alternatively, a timing generator may be provided separately and used to generate the clock signal with the pulse width that is shorter than the pulse width of the comparison signal. The clock signal generated by the timing generator may be a one shot pulse signal which is logic "H" only once over period that the comparison signal is "H".

In the first and second embodiments an example frequency synthesizer in which the oscillation frequency of the VCO 6 rises when the capacitor C terminal voltage rises, and falls when the capacitor C terminal voltage falls is described, but the invention can also be applied to a frequency synthesizer in which the oscillation frequency of the VCO 6 falls when the capacitor C terminal voltage rises, and rises when the capacitor C terminal voltage falls.

Further, the first and second embodiments are no more than example implementations of the present invention, and should not be interpreted as limiting the technical scope of the present invention. Various other implementations are possible without departing from the main characteristics or spirit of the present invention.

INDUSTRIAL APPLICABILITY

The present invention is applicable to a charge pump circuit equipped with a loop filter that includes a capacitor, and a frequency synthesizer using the charge pump circuit.

The invention claimed is:

1. A frequency synthesizer comprising:
   a phase comparator configured to detect a phase difference between a reference signal outputted from a reference frequency divider and a variable frequency signal outputted from a variable frequency divider and to output a comparison signal having a pulse width dependent on the detected phase difference;
   a signal generating circuit configured to generate a control signal obtained by taking a logical product of the comparison signal outputted from the phase comparator and a clock signal having a pulse width shorter than the comparison signal; and
   a charge pump circuit configured to perform, based on the control signal outputted from the signal generating circuit and using a constant current source, a charging operation or a discharging operation on a capacitor in a loop filter.

2. The frequency synthesizer according to claim 1, wherein the reference frequency divider generates the reference signal by dividing the frequency of the signal outputted from a crystal oscillation circuit using a fixed ratio, and the signal outputted from the crystal oscillation circuit or a signal outputted from the reference frequency divider midway through the division is used as the clock signal.

3. The frequency synthesizer according to claim 1, wherein the charge pump circuit includes a switching circuit configured to switch between connection and disconnection of the constant current source based on the control signal outputted from the signal generating circuit.

4. A charge pump circuit comprising:
   a signal generating circuit configured to generate a control signal obtained by taking a logical product of a comparison signal outputted from a phase comparator and a clock signal having a pulse width shorter than the comparison signal; and
   a loop filter configured to perform, based on the control signal outputted from the signal generating circuit and using a constant current source, a charging operation or a discharging operation on a capacitor.

5. The charge pump circuit according to claim 4, further comprising:
   a switching circuit configured to switch between connection and disconnection of the constant current source based on the control signal outputted from the signal generating circuit.

* * * * *